(12) United States Patent
Jalili Sebardan et al.

(10) Patent No.: US 11,626,846 B2
(45) Date of Patent: Apr. 11, 2023

(54) DIFFERENTIAL AMPLIFIER CIRCUITRY

(71) Applicant: SOCIONEXT INC., Kanagawa (JP)

(72) Inventors: Armin Jalili Sebardan, Maidenhead (GB); Alistair John Gratrex, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/716,725

(22) Filed: Apr. 8, 2022

(65) Prior Publication Data

US 2022/0239265 A1 Jul. 28, 2022

Related U.S. Application Data

(62) Division of application No. 16/894,590, filed on Jun. 5, 2020, now Pat. No. 11,336,245.

(30) Foreign Application Priority Data

Jun. 5, 2019 (EP) ..................................... 19178397

(51) Int. Cl.
*H03F 3/45* (2006.01)
*H03F 1/32* (2006.01)

(52) U.S. Cl.
CPC ....... *H03F 3/45264* (2013.01); *H03F 1/3205* (2013.01); *H03F 1/3211* (2013.01);
(Continued)

(58) Field of Classification Search
CPC .................................................. H03F 3/45264
See application file for complete search history.

(56) References Cited

U.S. PATENT DOCUMENTS 4,545,076 A 10/1985 Biard et al.
5,422,529 A * 6/1995 Lee ..................... H03F 3/45183
327/563

(Continued)

OTHER PUBLICATIONS

European Office Action issued in European Patent Application No. 19178397.6, dated Jun. 7, 2022.

(Continued)

*Primary Examiner* — Patricia T Nguyen
(74) *Attorney, Agent, or Firm* — McDermott Will & Emery LLP

(57) ABSTRACT

Differential amplifier circuitry including: first and second main transistors of a given conductivity type; and first and second auxiliary transistors of an opposite conductivity type, where the first and second main transistors are connected along first and second main current paths passing between first and second main voltage reference nodes and first and second output nodes, respectively, with their source terminals connected to the first and second output nodes, respectively, and with their gate terminals controlled by component input signals of a differential input signal; and the first and second auxiliary transistors are connected along first and second auxiliary current paths passing between first and second auxiliary voltage reference nodes and the first and second output nodes, respectively, with their drain terminals connected to the first and second output nodes, respectively, and with their gate terminals controlled by the component input signals of the differential input signal.

16 Claims, 11 Drawing Sheets

(52) U.S. Cl.
CPC .............. *H03F 2203/45296* (2013.01); *H03F 2203/45298* (2013.01); *H03F 2203/45318* (2013.01); *H03F 2203/45326* (2013.01)

(56) References Cited

U.S. PATENT DOCUMENTS

| | | | |
|---|---|---|---|
| 5,481,224 A | 1/1996 | Kimura | |
| 5,789,949 A | 8/1998 | Giordano et al. | |
| 6,396,329 B1 * | 5/2002 | Zerbe ................... | G11C 7/1084 327/333 |
| 6,985,035 B1 * | 1/2006 | Khorramabadi ....... | H03H 11/10 330/252 |
| 7,119,612 B1 | 10/2006 | Holloway et al. | |
| 7,848,724 B2 | 12/2010 | Bult et al. | |
| 8,390,378 B2 | 3/2013 | Gnai | |
| 8,446,203 B1 | 5/2013 | Adut | |
| 9,124,229 B2 | 9/2015 | Suetinov et al. | |
| 2002/0075074 A1 | 6/2002 | Wang et al. | |
| 2006/0229046 A1 | 10/2006 | Bult et al. | |
| 2008/0036536 A1 * | 2/2008 | Khorramabadi ..... | H03B 5/1228 330/252 |
| 2009/0219094 A1 * | 9/2009 | Kim ...................... | H03D 7/1491 330/253 |
| 2011/0130109 A1 | 6/2011 | Ogasawara | |
| 2012/0013404 A1 | 1/2012 | Ngai | |
| 2014/0266439 A1 | 9/2014 | Suetinov et al. | |
| 2016/0006395 A1 * | 1/2016 | Kim ...................... | H03F 1/3205 330/261 |
| 2020/0225392 A1 | 7/2020 | Magnusson | |

OTHER PUBLICATIONS

Extended European Search Report issued in European Patent Application No. 19178397.6, dated Nov. 18, 2019.
Notice of Allowance and Fees Due issued in corresponding U.S. Appl. No. 16/894,590, dated Jan. 10, 2022.

* cited by examiner

DIFFERENTIAL AMPLIFIER CIRCUITRY

CROSS-REFERENCE OF RELATED APPLICATIONS

This application is a divisional under 35 U.S.C. § 111(a) of U.S. patent application Ser. No. 16/894,590, filed on Jun. 5, 2020, which in turn claims the benefit of European Patent Application No. 19178397.6, filed on Jun. 5, 2019, the entire disclosures of which Applications are incorporated by reference herein.

The present invention relates to differential amplifier circuitry, in particular to differential source follower circuitry.

By way of background, FIG. 1 is a schematic diagram of previously-considered source follower circuitry 1. The source follower circuitry 1 comprises an input transistor 2 (M1) and a bias transistor 4 (Mb), both of which are n-channel field-effect transistors (e.g. NMOS transistors) in this example. An input voltage signal (Vin) is applied to the gate terminal of the input transistor 2 (M1), and an output voltage signal (Vout) is taken from its source terminal. The drain terminal of the bias transistor 4 (Mb) is connected to the source terminal of the input transistor 2 and its source terminal is connected to ground 6. The drain terminal of the input transistor 2 (M1) is connected to VDD 8 (a voltage reference or voltage supply). A bias voltage is applied to the gate terminal of the bias transistor 4 in order to control the bias point of the input transistor 2. The bias transistor 4 (Mb) acts as a current source, controlling a bias current flowing through the two transistors 2, 4. The source follower circuitry 1 presents a high impedance to a preceding circuit stage and this is one reason why such source follower circuitry may be used as a voltage buffer.

As explained in more detail later, it has been found that such source follower circuitry suffers from gain loss due to channel length modulation (CLM) effects and limited output impedance of the input transistor 2 and the bias transistor 4. The linearity of the source follower circuitry 1 is also degraded due to the CLM effect and variation in the output impedance with respect to the input signal.

It is desirable to address such problems.

According to an embodiment of a first aspect of the present invention, there is provided differential amplifier circuitry (or differential circuitry, or differential source follower circuitry) configured to generate a differential output signal between first and second output nodes based on a differential input signal provided between first and second input nodes, the circuitry comprising: first and second main transistors of a given conductivity type; and first and second auxiliary transistors of an opposite conductivity type to the given conductivity type, wherein the first and second main transistors are connected along first and second main current paths which pass between first and second main voltage reference nodes and the first and second output nodes, respectively, with their source terminals connected to the first and second output nodes, respectively, and with their gate terminals connected to be controlled by component input signals of the differential input signal provided at the first and second input nodes, respectively; and the first and second auxiliary transistors are connected along first and second auxiliary current paths which pass between first and second auxiliary voltage reference nodes and the first and second output nodes, respectively, with their drain terminals connected to the first and second output nodes, respectively, and with their gate terminals connected to be controlled by the component input signals of the differential input signal provided at the second and first input nodes, respectively.

Thus, the cross coupling configuration of the first and second auxiliary transistors leads to increased gain and improved linearity without any additional power consumption. Further details of the associated advantages are provided later herein.

The gate terminals of the first main transistor and the second auxiliary transistor may be connected directly to the first input node.

The gate terminals of the second main transistor and the first auxiliary transistor may be connected directly to the second input node.

The gate terminals of the first and second auxiliary transistors may be controlled by intermediate circuitry which is connected between the gate terminals of the first and second auxiliary transistors and the second and first input nodes, respectively.

The component input signals of the differential input signal may be a first and second input signal provided at the first and second input nodes, respectively. The first input signal may be inversely proportional to the second input signal. The first and second input signals may be directly input to the first and second input nodes, respectively.

The differential input signal may be provided by an input voltage supply.

The gate terminals of the first main transistor and the second auxiliary transistor may be directly controlled by the first input signal provided at the first input node. The gate terminals of the second main transistor and the first auxiliary transistor may be directly controlled by the second input signal provided at the second input node.

The first and second output nodes may be connected directly to the first and second main current paths, respectively.

The first and second main voltage reference nodes may be connected directly to the first and second main current paths, respectively.

The first and second output nodes may be connected via first and second combined current paths to first and second common voltage reference nodes, respectively.

Current flowing in the first combined current path may be a first current combination comprising (a sum of) currents flowing from (or in) the first auxiliary current path and the first main current path.

First and second current sources may be connected along the first and second combined current paths, respectively, whereby a first sum of currents flowing in the first main current path and the first auxiliary current path flows in the first combined current path and is controlled by the first current source, and whereby a second sum of currents flowing in the second main current path and the second auxiliary current path flows in the second combined current path and is controlled by the second current source.

Current flowing in the second combined current path may be a second current combination comprising (a sum of) currents flowing from (or in) the second auxiliary current path and the second main current path.

The first and second current sources may be or comprise first and second bias transistors, respectively.

The first current source may regulate the first sum of currents, and optionally a DC component of the first sum of currents; and the second current source may regulate the second sum of currents, and optionally a DC component of the second sum of currents.

The first and second current sources may regulate DC components of the first and second sums of currents to be the same as one another. Where there are pairs of first and second corresponding transistors and/or impedances, the transistors and/or impedances of each pair may be matched or have substantially the same configuration (e.g. sizes, dimensions, parameter values) as one another.

The first and second current sources may control the first and second sums of currents to be substantially constant (in particular, to have substantially constant DC components). That is, the first and second sums of currents may be controlled to remain at first and second predetermined current (DC) values, respectively. The combined value of the first and second predetermined (DC) current values may constitute a maximum (DC) power consumption value of the differential amplifier circuitry.

The first and second main voltage reference nodes may be connected to a main voltage supply (e.g. VDD1); the first and second auxiliary reference nodes may be connected to an auxiliary voltage supply (e.g. VDD2): and the first and second common reference nodes may be connected to a common voltage reference or supply (e.g. GND).

The main voltage supply and the auxiliary voltage supply may be referred to as the main voltage reference and the auxiliary voltage reference, respectively.

The main and auxiliary voltage supplies may provide the same voltage as one another, and are optionally the same voltage reference or supply as one another; or the main and auxiliary voltage supplies may provide different voltages from one another.

The first and second main transistors may be NMOS (or n-channel) transistors; the first and second auxiliary transistors may be PMOS (or p-channel) transistors; the main and auxiliary voltage supplies may provide high voltages and the common voltage reference or supply may provide a low voltage.

The first and second main transistors may be PMOS (or p-channel) transistors; the first and second auxiliary transistors may be NMOS (or n-channel) transistors; the main and auxiliary voltage supplies may provide low voltages and the common voltage reference may provide a high voltage.

The source terminals of the first and second auxiliary transistors may be connected (e.g. directly) to the first and second auxiliary voltage reference nodes, respectively.

The source terminals of the first and second auxiliary transistors may be connected to the first and second auxiliary voltage reference nodes, respectively, via respective first and second impedances.

The first and second impedances may each comprise a resistor connected between the source terminals of the first and second auxiliary transistors and the first and second auxiliary voltage reference nodes, respectively.

The first and second impedances may each further comprise a capacitor connected in parallel with the resistor.

First and second intermediate transistors of the given conductivity type may be connected along first and second intermediate current paths which pass between first and second intermediate voltage reference nodes and first and second common voltage reference nodes, respectively, with their source terminals connected to the first and second common voltage reference nodes, respectively, and with their gate terminals connected to be controlled by the component input signals of the differential input signal provided at the second and first input nodes, respectively; and first and second diode-connected transistors of the opposite conductivity type may be connected along the first and second intermediate current paths with their gate terminals connected to the gate terminals of the first and second auxiliary transistors, respectively, so that the first diode-connected and auxiliary transistors form a first current mirror and so that the second diode-connected and auxiliary transistors form a second current mirror.

The first and second diode-connected transistors may be configured such that their gate terminals are directly connected to their drain terminals.

The source terminals of the first and second intermediate transistors may be connected to the first and second common voltage reference nodes, respectively, via respective first and second impedances.

The first and second impedances may each comprise a resistor connected between the source terminals of the first and second intermediate transistors and the first and second common voltage reference nodes, respectively.

The first and second impedances may each further comprise a capacitor connected in parallel with the resistor.

The source terminals of the first and second diode-connected transistors may be connected (e.g. directly) to (the) first and second intermediate voltage reference nodes, respectively.

The first and second main voltage reference nodes may be connected to a main voltage supply; the first and second auxiliary reference nodes may be connected to an auxiliary voltage supply; the first and second intermediate reference nodes may be connected to an intermediate voltage supply; and the first and second common reference nodes may be connected to a common voltage reference or supply.

The main voltage supply, the auxiliary voltage supply and the intermediate voltage supply may be referred to as the main voltage reference, the auxiliary voltage reference and the intermediate voltage reference, respectively.

At least two of the main, intermediate and auxiliary voltage supplies may provide the same voltage as one another, and are optionally the same voltage supply as one another.

A differential output node may be connected to the first output node and the second output node, wherein a difference between the first sum of currents and the second sum of currents is output from the differential output node.

As a second aspect, differential amplifier circuitry may comprise a first main transistor of a first conductive type, whose source is connected to a first output node, whose gate is connected to a first input node, and whose drain is connected to a first voltage source line; a first auxiliary transistor of a second conductive type which is opposite to the first conductive type, whose drain is connected to the first output node, whose gate is connected to a second input node, whose source is connected to a second voltage source line; a second main transistor of the first conductive type, whose source is connected to a second output node, whose gate is connected to the second input node, and whose drain is connected to the first voltage source line; and a second auxiliary transistor of the second conductive type, whose drain is connected to the second output node, whose gate is connected to the first input node, and whose source is connected to the second voltage source line.

According to an embodiment of a third aspect of the present invention, there is provided programmable gain amplifier circuitry comprising the differential amplifier circuitry according to the aforementioned first or second aspect of the present invention.

According to an embodiment of a fourth aspect of the present invention, there is provided integrated circuitry such as an IC chip comprising the differential amplifier circuitry according to the aforementioned first or second aspect of the present invention or the programmable gain amplifier circuitry according to the aforementioned third aspect of the present invention.

Reference will now be made, by way of example; to the accompanying drawings, of which:

Figure 1:
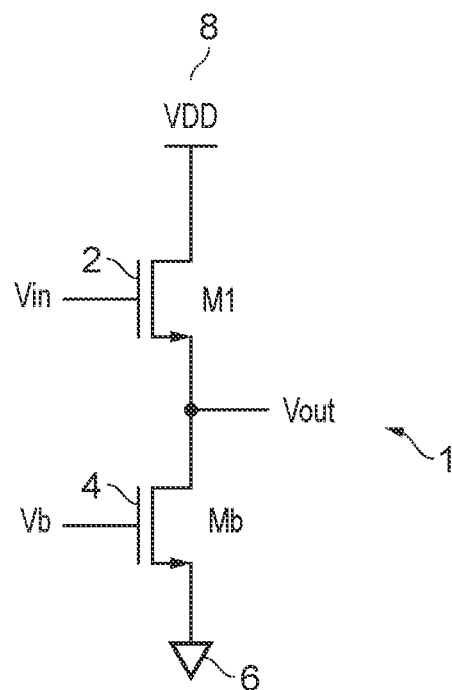
FIG. 1 is a schematic diagram of previously-considered source follower circuitry.
Figure 5:
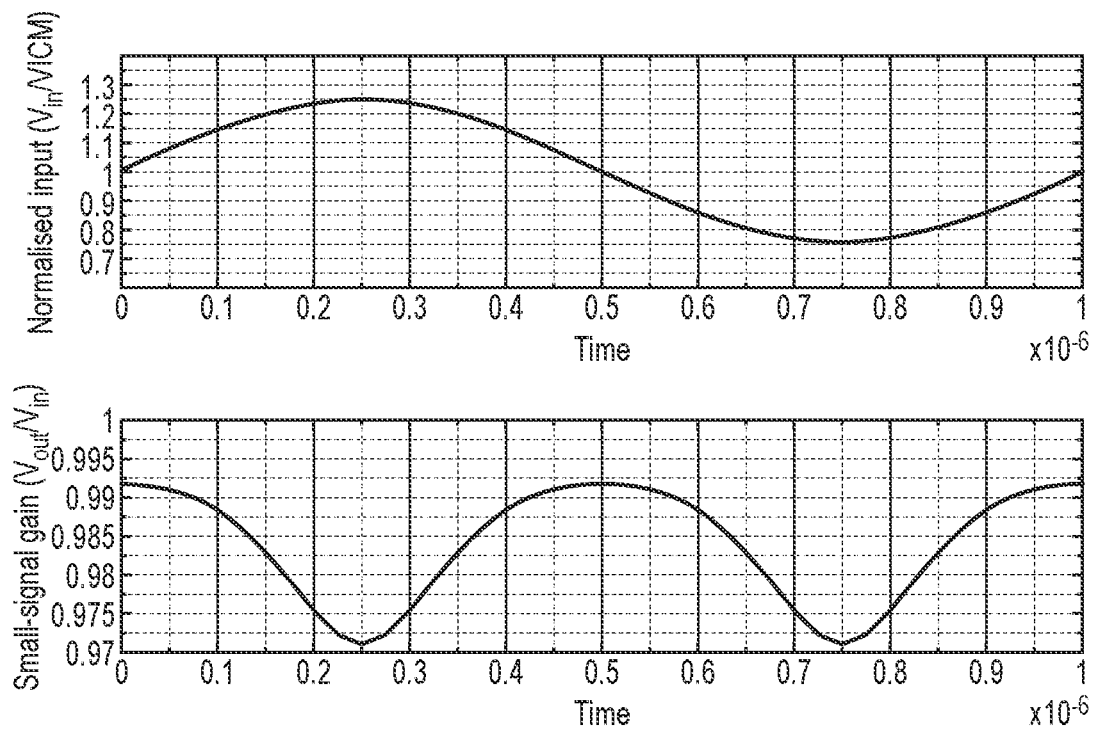
Figure 6:
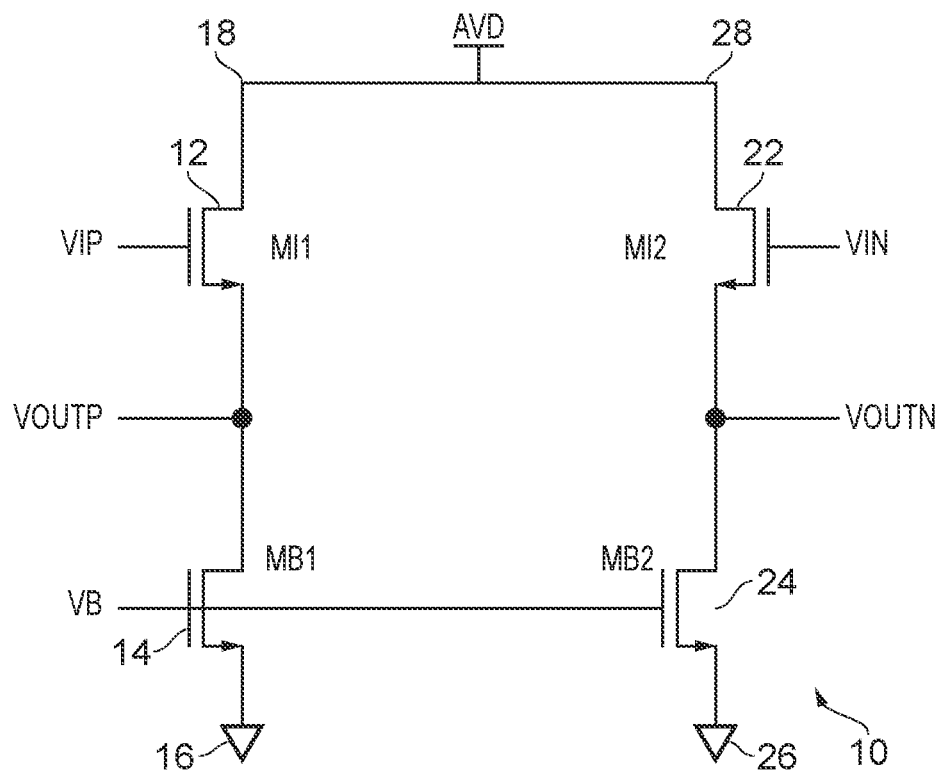
Figure 7:
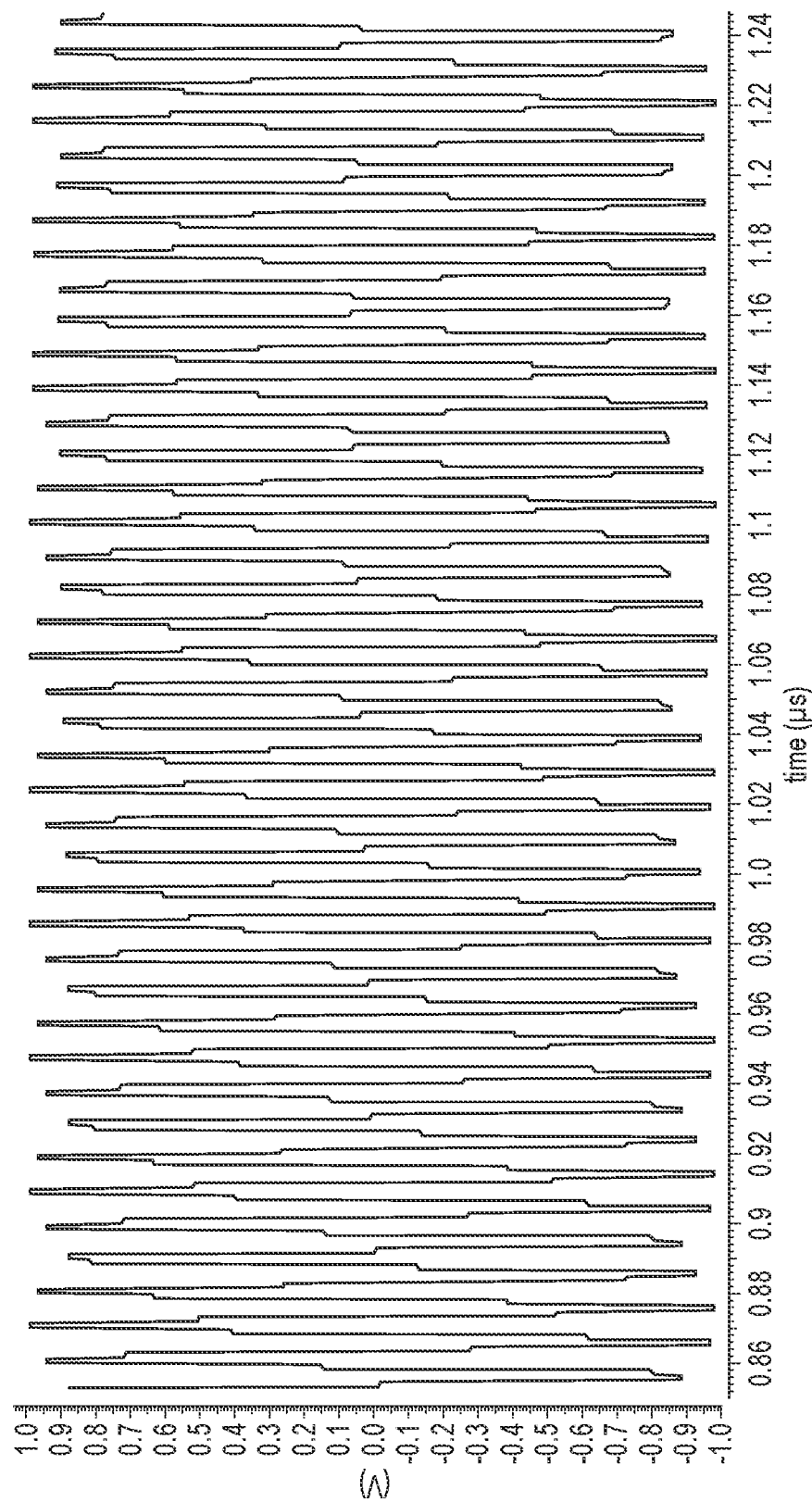
Figure 8:
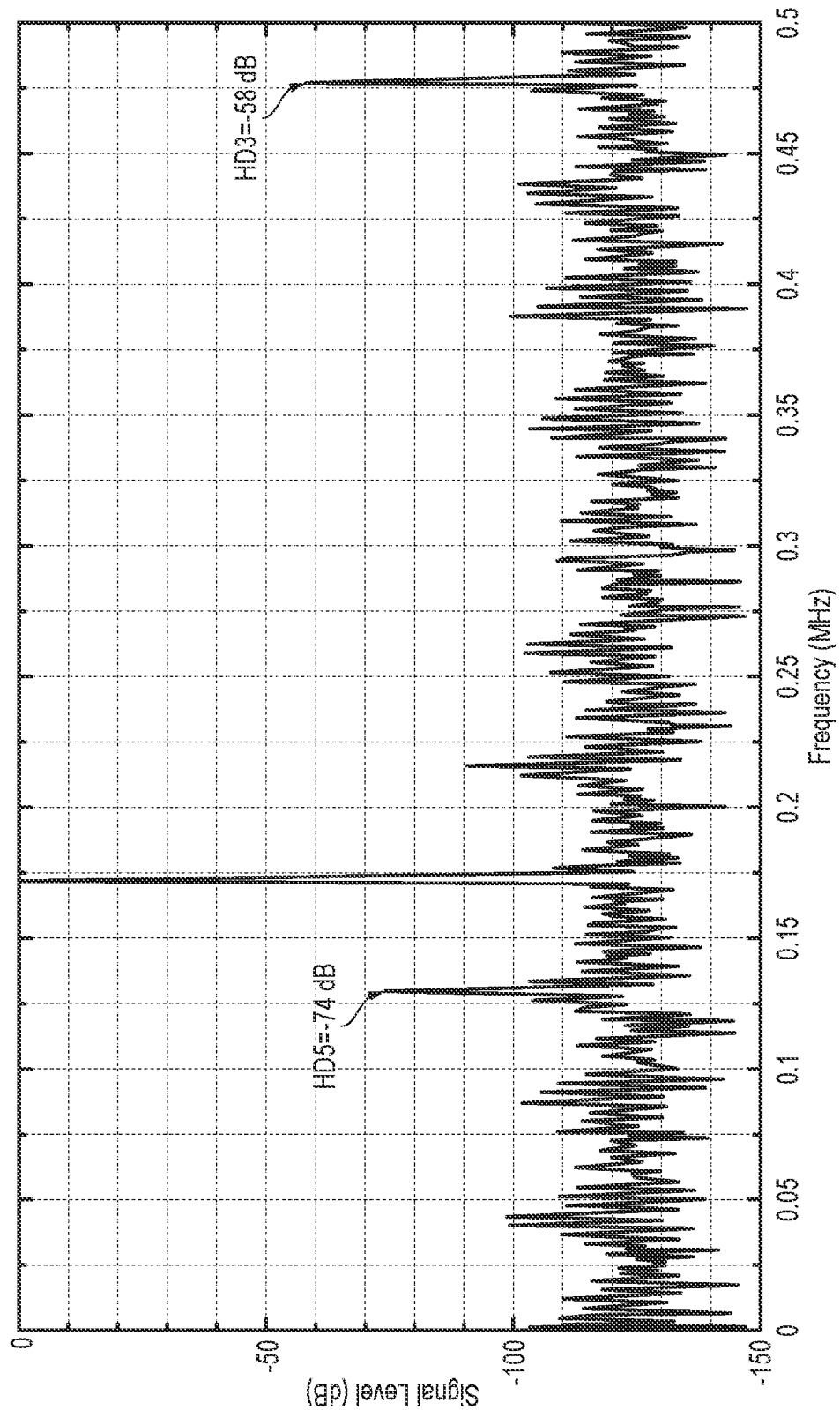
Figure 9:
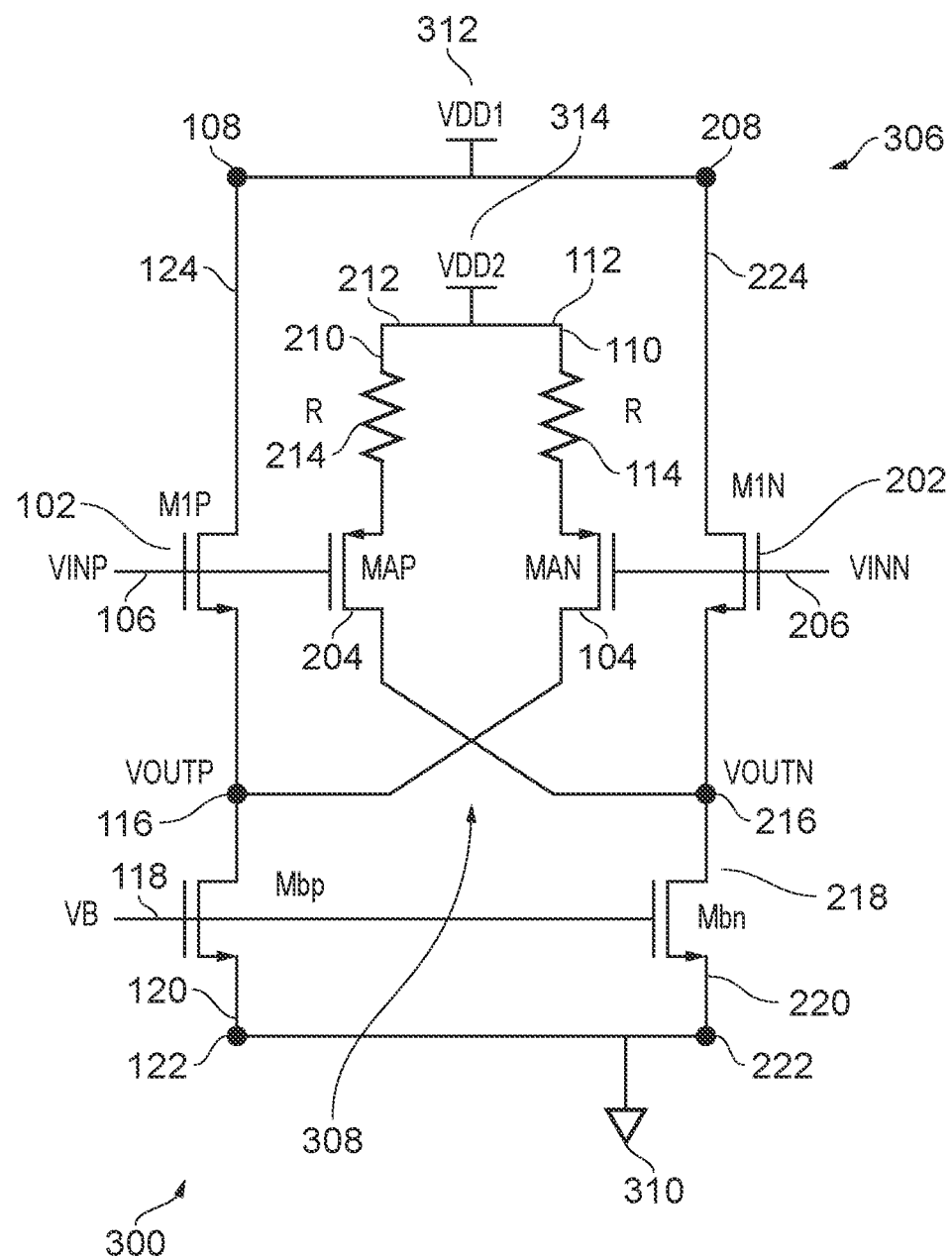
Figure 10:
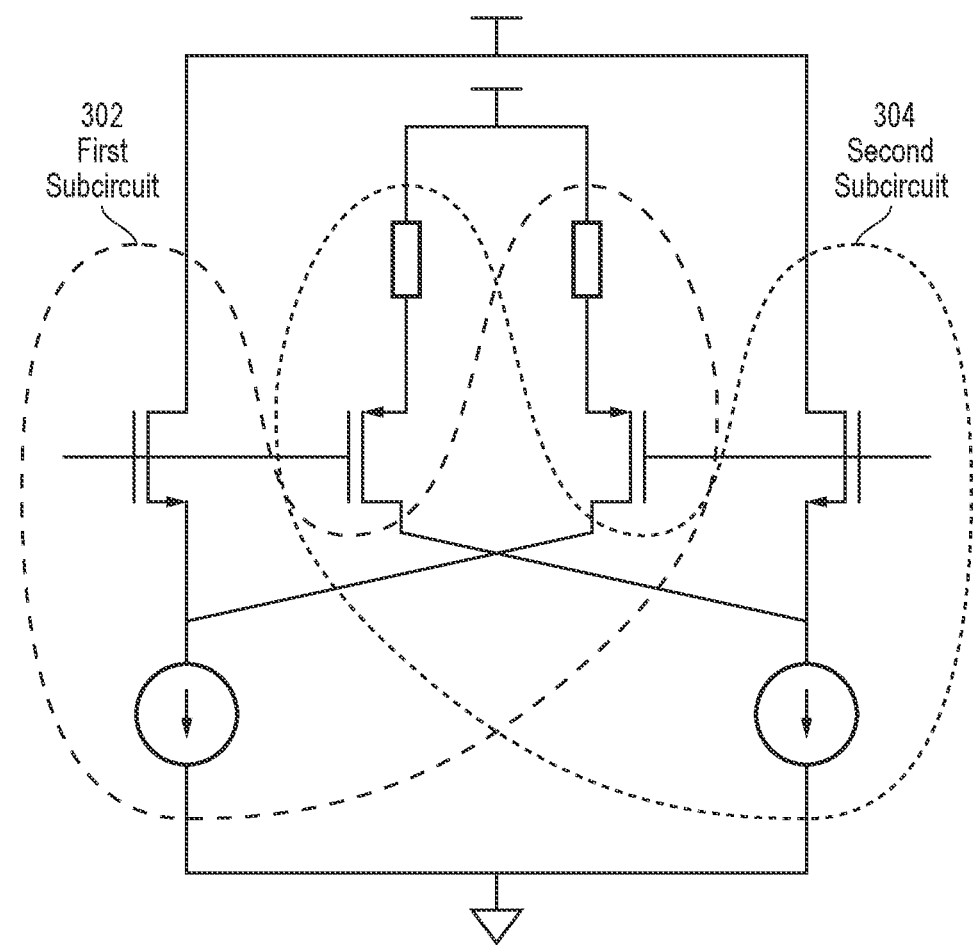
Figure 11:
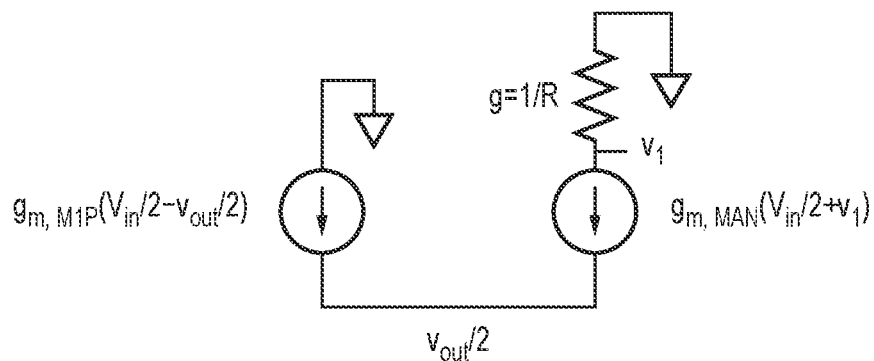
Figure 12:
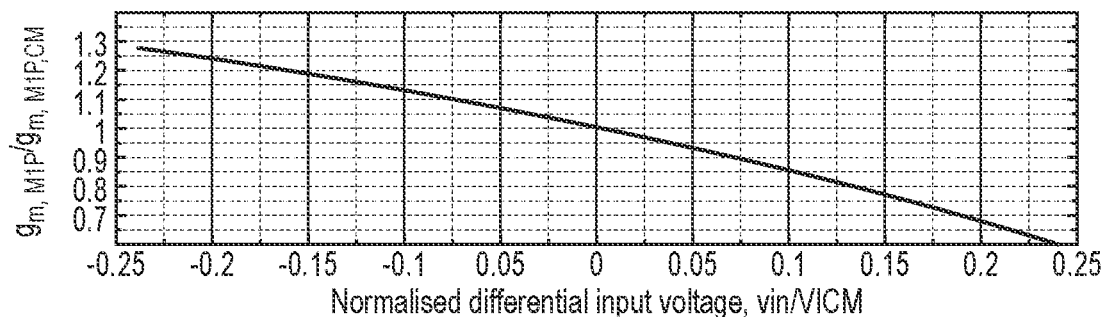
Figure 12:
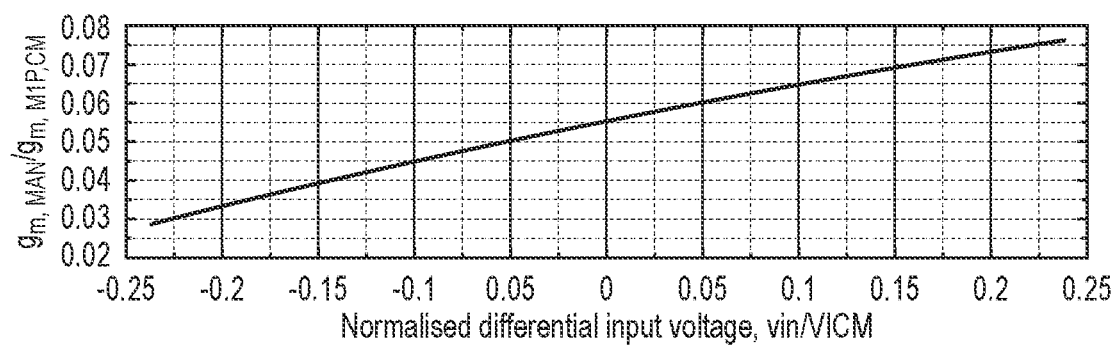
Figure 13:
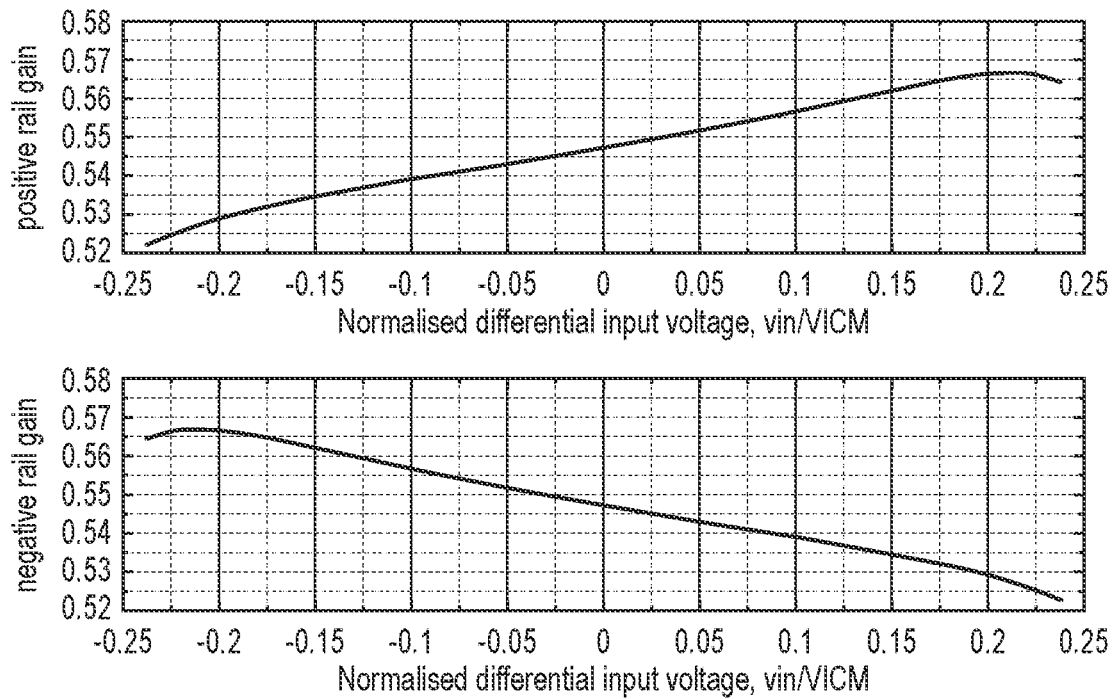
Figure 14:
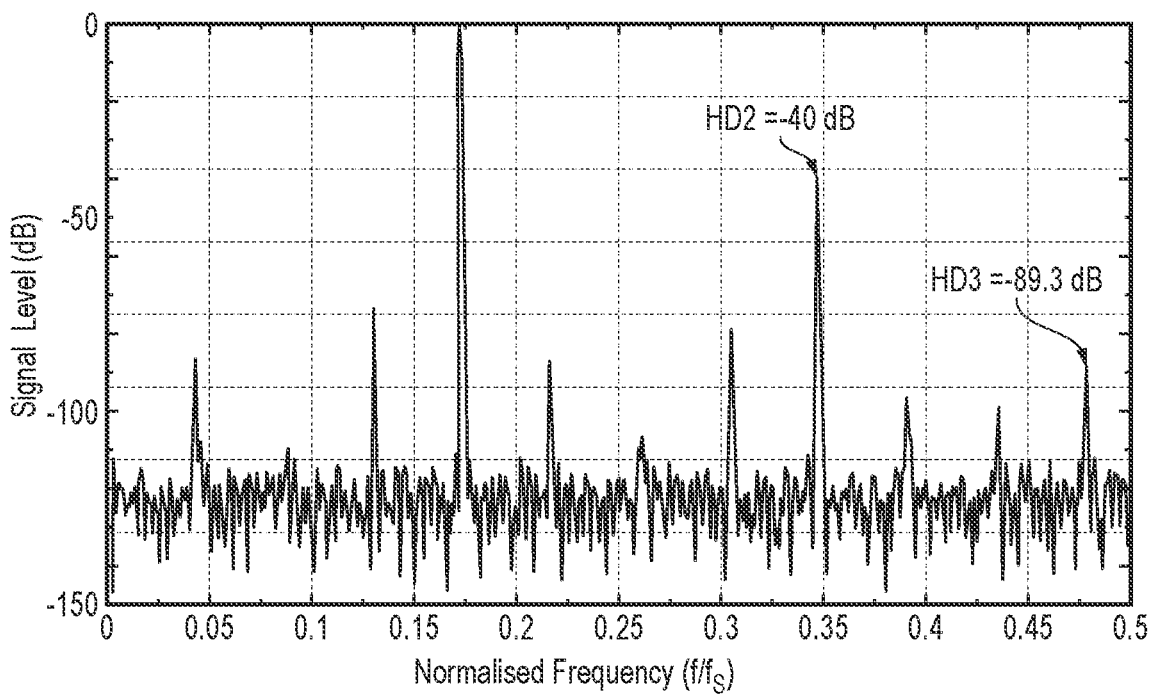
Figure 15:
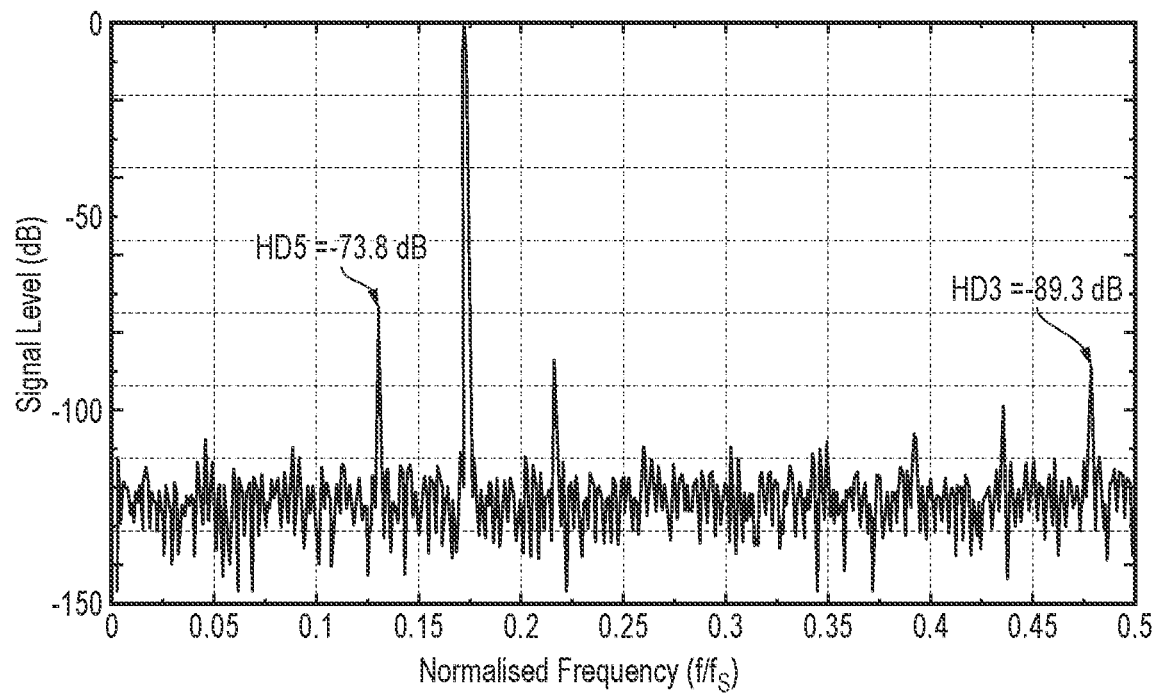
Figure 17:
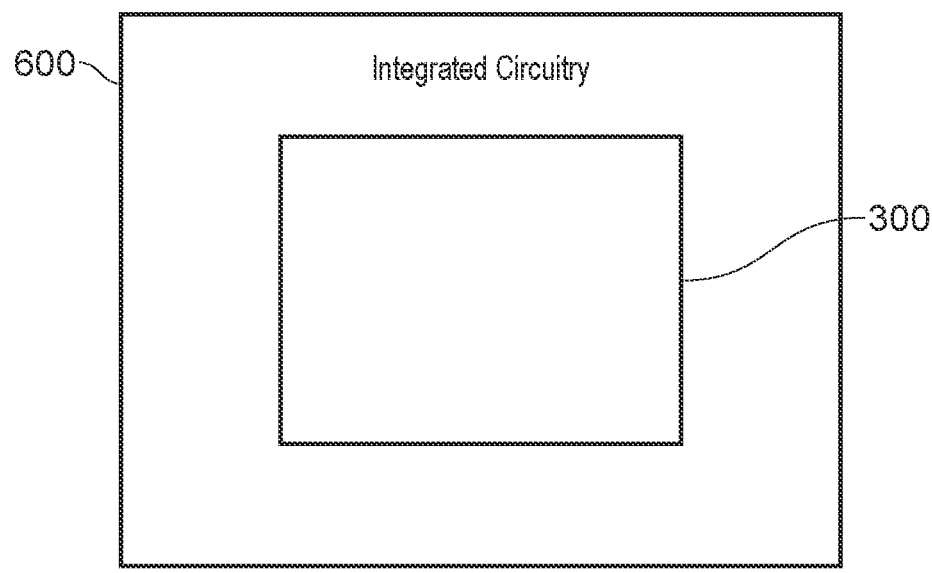
Figure 16:
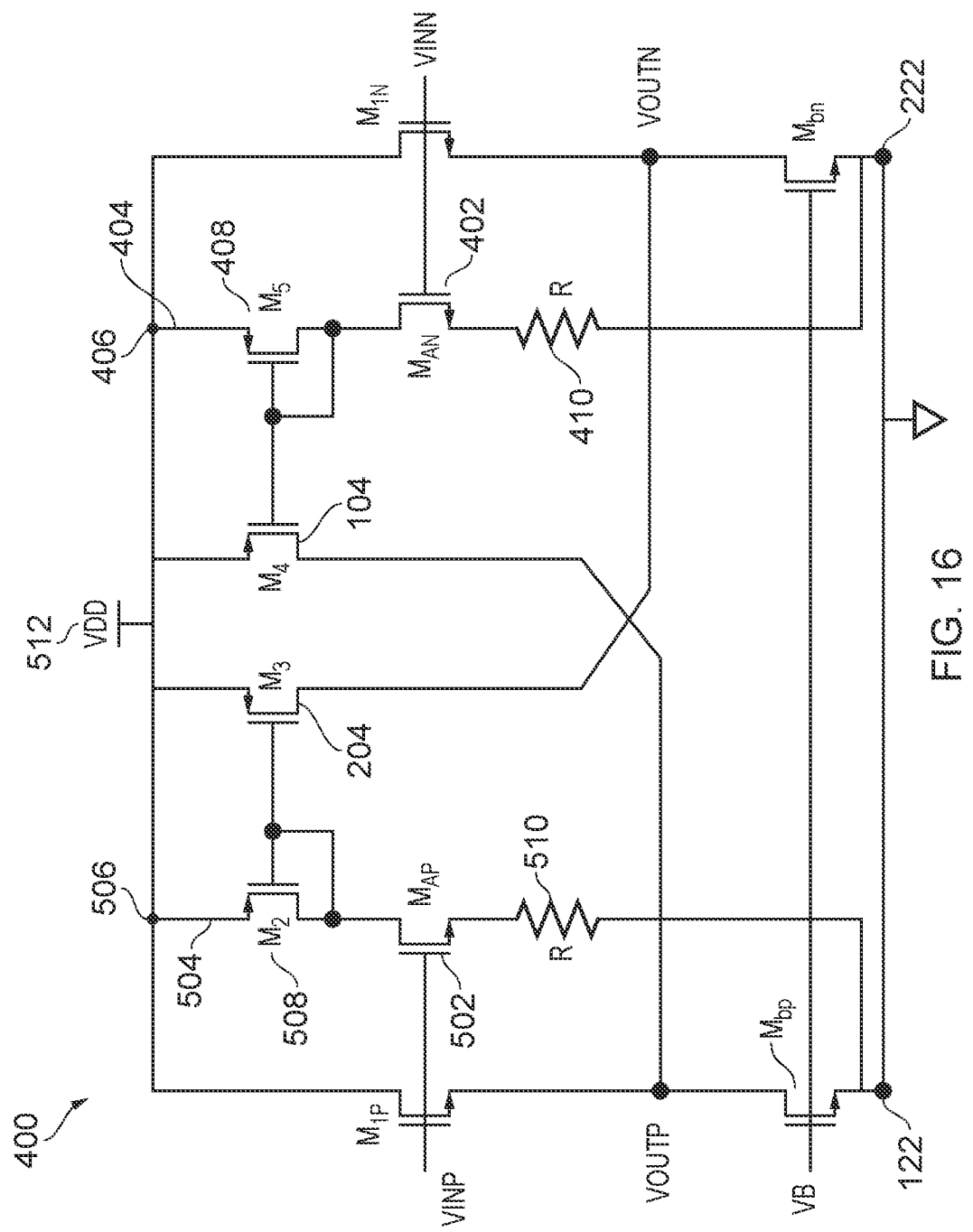

FIG. 5 presents graphs useful for understanding variation of small-signal gain (bottom graph) with respect to the input signal (top graph) of the circuitry of FIG. 1;

FIG. 6 is a schematic diagram of pseudo differential source follower circuitry;

FIG. 7 is a graph of an example differential output of the circuitry of FIG. 6;

FIG. 8 is a graph of a Fast Fourier Transform (FFT) of the differential output of FIG. 7;

FIG. 9 is a schematic diagram of differential amplifier circuitry according to an embodiment of the present invention;

FIG. 10 is a schematic diagram useful for understanding the FIG. 9 circuitry;

FIG. 11 is another schematic diagram useful in understanding the FIG. 9 circuitry;

FIG. 12 is a graph useful for understanding transconductances of transistors in the circuitry of FIG. 9;

FIG. 13 is a graph useful for understanding small signal single-ended gain of the circuitry of FIG. 9;

FIG. 14 is a graph of an FFT of an output signal of the FIG. 9 circuitry;

FIG. 15 is a graph of an FFT of a differential output of the FIG. 9 circuitry;

FIG. 16 is a schematic diagram of a variation of the differential amplifier circuitry of FIG. 9; and FIG. 17 is a schematic diagram of integrated circuitry embodying the present invention.

Before considering an embodiment of the present invention, the so e follower circuitry of FIG. 1 will be considered in more detail.

The gain $A_v$ of the source follower circuitry 1 illustrated in FIG. 1 can be calculated using small signal model analysis, as follows:

$$A_v = \frac{v_{out}}{v_{in}} = \frac{g_{m1}}{g_{m1} + g_{o1} + g_{ob}} \quad (1)$$

where $g_{m1}$, is the transconductance of the input transistor 2, $g_{o1}$ is the output conductance of the input transistor 2 and $g_{ob}$ is the output conductance of the bias transistor 4. Vin is the input signal and Vout is the output signal as mentioned earlier.

In large-signal applications, the transconductance and especially the output conductances of the transistors vary significantly with respect to the signal amplitude. This creates a variation of the gain $A_v$ as a function of the input signal, represented as $A_v(Vin)$, and generates an output signal represented as:

$$V_{out} = A_V(V_{in}) \times V_{in} \quad (2)$$

The variation of gain as a function of the input signal, as illustrated in equation (2), creates harmonic distortion in the output signal.

Furthermore, when the input signal increases the output signal also increases thereby causing the drain-source voltage of the input transistor 2 to reduce. Due to the CLM effect, a reduction in the drain-source voltage causes the output conductance $g_{o1}$ to increase. On the other hand, the drain-source of the bias transistor 4 increases when the input signal increases, which causes the output conductance $g_{ob}$ to reduce. The relationship between input signal and the transistor conductances is illustrated by equation (3):

$$V_{in} = V_{in,max} : g_{o1} = g_{o1,max} \text{ and } g_{ob} = g_{ob,min} \quad (3)$$

Conversely, when the input signal reduces the output conductance of input transistor 2 reduces and the output conductance of the bias transistor 4 increases. This relationship is illustrated by equation (4):

$$V_{in} = V_{in,min} : g_{o1} = g_{o1,min} \text{ and } g_{ob} = g_{ob,max} \quad (4)$$

Figure 2:
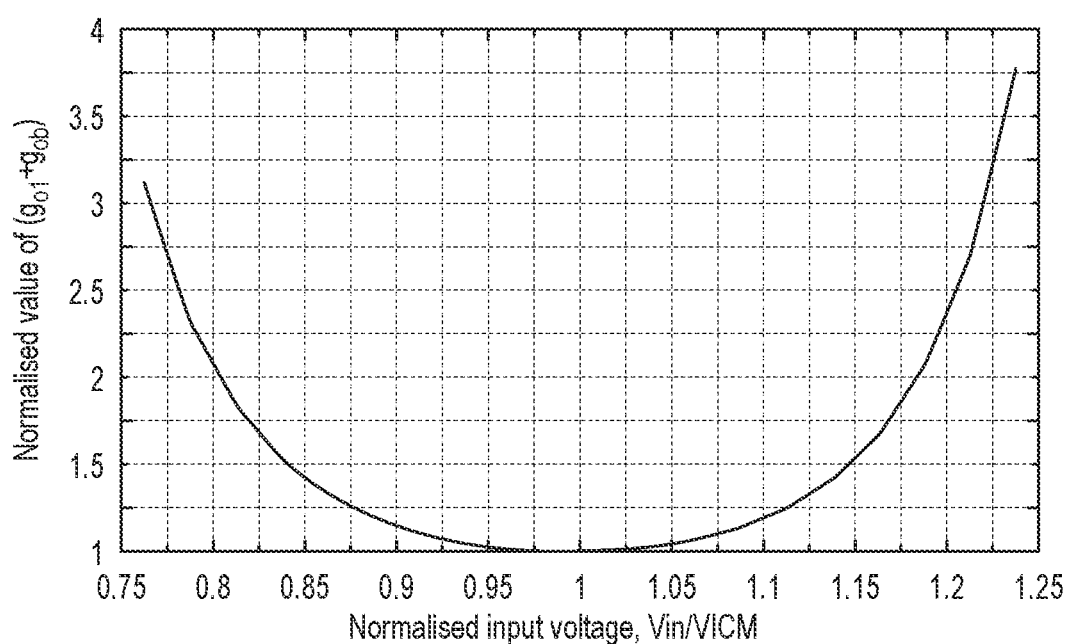
FIG. 2 is a graph useful for understanding output conductances of transistors in the circuitry of FIG. 1.

Equations (3) and (4) indicate that the summation of the output conductances (i.e., $g_{o1} + g_{ob}$) varies roughly as a parabola with respect to the input signal, as illustrated by the graph of FIG. 2.

FIG. 2 is a graph which illustrates (for the source follower circuitry 1) variation of the summation of the above output conductances normalised to the common mode value (i.e. $(g_{o1}+g_{ob})/(g_{o1}+g_{ob})_{min}$ along the y-axis) with respect to the input signal, which is also normalised to the common mode value (i.e., $V_{in}/VICM$ along the x-axis), where VICM is the common mode input voltage value. That is, the value 1 indicates the normalised common mode value on both axes. The results illustrated by FIG. 2 were obtained by simulation in 16 nm FinFET (Fin Field-Effect Transistor) technology.

The summation of output conductances illustrated in FIG. 2 indicates that the variation of the gain, illustrated by equation (1), follows effectively the same parabola pattern with respect to the input signal.

Figure 3:
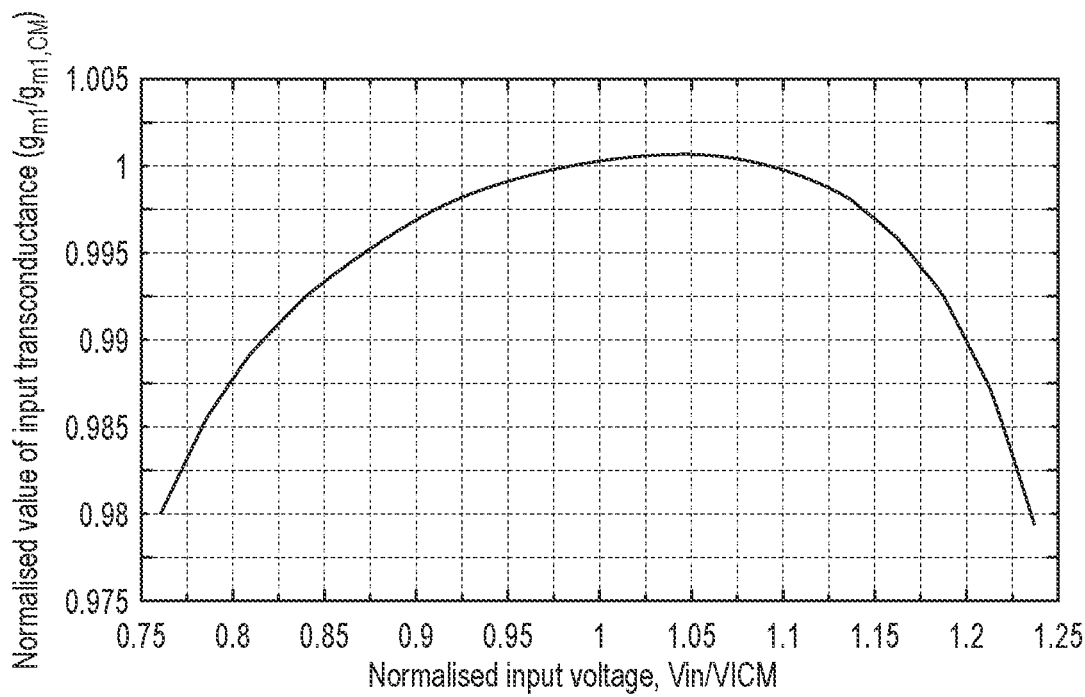
FIG. 3 is a graph useful for understanding transconductance of an input transistor in the circuitry of FIG. 1.

Another notable feature of the source follower circuitry 1 is that if the bias current controlled by the bias transistor 4 (Mb) is relatively stable with respect to the input signal, the relative variation of the input transistor transconductance is much less than the transistor output transconductances. FIG. 3 is a graph showing (for the source follower circuitry 1) variation in the input transistor transconductance normalised to the common mode (CM) value (i.e. $g_{m1}/g_{m1,CM}$ along the y-axis) with respect to the input signal, which is also normalised to the common mode value (i.e. $V_{in}/VICM$ along the x-axis). As with FIG. 2, the results illustrated by FIG. 3 were obtained by simulation in 16 nm FinFET technology.

As illustrated by FIG. 3, the relative changes in the input transistor transconductance is around 2% compared to around 200% variation of the transistor output conductances shown in FIG. 2. This further indicates that the variation of the gain, as illustrated by equation (1), follows effectively the same parabola pattern as in FIG. 2. That is, variation of the gain is mainly dominated by the output conductance variation.

Figure 4:
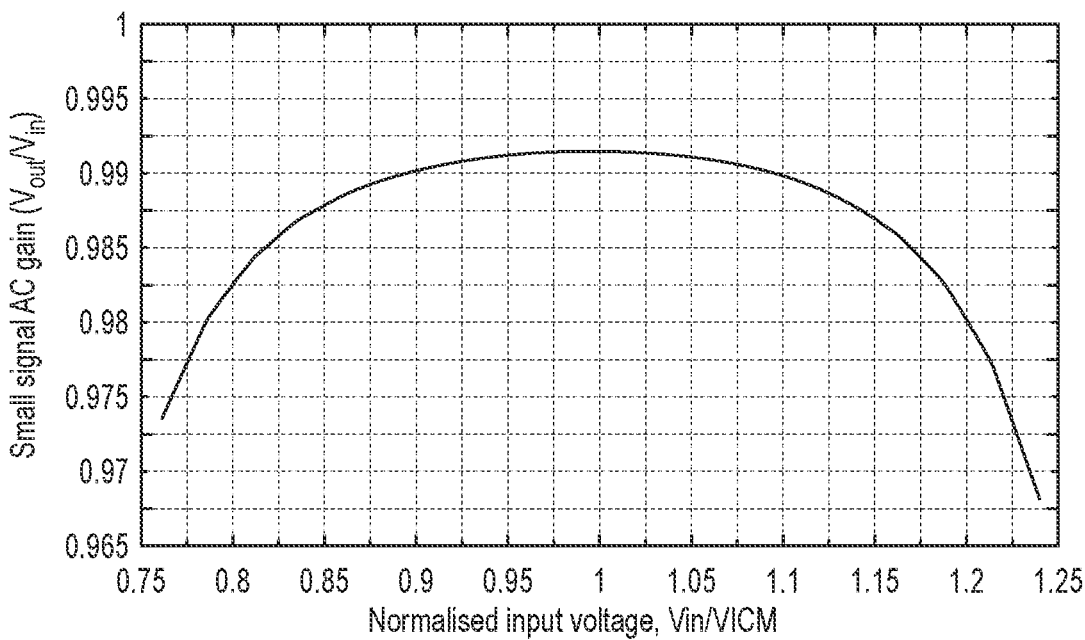
FIG. 4 is a graph useful for understanding variation of small signal AC gain of the circuitry of FIG. 1.

FIG. 4 is a graph which illustrates (for the source follower circuitry 1) variation of small signal AC gain with respect to the input signal normalised to the common mode value (i.e. $V_{in}/VICM$). As with FIGS. 2 and 3, the results illustrated by FIG. 4 were obtained by simulation in 16 nm FinFET technology.

As illustrated by FIG. 4, the gain of the source follower circuitry 1 has a similar parabola profile to that of the summed output conductances illustrated in FIG. 2. The parabola profile of FIG. 4 indicates that in a case where a single tone sine wave is used as the input Vin of the source follower circuitry 1, the gain varies as shown in FIG. 5.

FIG. 5 presents graphs which illustrate (for the source follower circuitry 1) variation of the small-signal gain (bottom graph of FIG. 5) with respect to the variation of the input signal (top graph of FIG. 5), where the input signal is normalised to the common mode value (i.e., $V_{in}$/VICM). As with FIGS. 2, 3 and 4, the results illustrated by FIG. 5 were obtained by simulation in 16 nm FinFET technology.

The results illustrated by FIGS. 4 and 5 indicate that the small signal gain of the source follower circuitry 1 can be represented as follows:

$$A_v = A_{v0} + av(V_{in}^2) \quad (5)$$

where $A_{v0}$) is the constant term and $av(V_{in}^2)$ is the input signal dependent term of the gain. Based on equation (5), the output signal can be expressed as follows:

$$V_{out} = V_{in} \times A_V \rightarrow V_{out} = (A_{v0} \times V_{in}) + (V_{in} \times av(V_{in}^2)) \quad (6)$$

The second term in equation (6) (in particular the term $av(V_{in}^2)$) shows the non-linearity of the output signal, which can be represented with an n-order polynomial, as follows:

$$a_v(X) = \alpha_1 \cdot X + \alpha_2 \cdot X^2 + \alpha_3 \cdot X^3 + \quad (7)$$

Substituting equation (7) into equation (6) gives the following equation:

$$V_{out} = (A_{v0} \times V_{in}) + (\alpha_1 \cdot V_{in}^3 + \alpha_2 \cdot V_{in}^5 + \alpha_3 \cdot V_{in}^7 + \dots) \quad (8)$$

Equation (8) indicates that applying a single tone sine wave as an input Vin to the source follower circuitry 1 of FIG. 1 causes third, fifth and subsequent odd order harmonics to be present in the output signal. When the source follower circuitry 1 is arranged in a differential structure, as illustrated in FIG. 6, the odd order harmonics are also present in the fully differential output: VOUTP–VOUTN.

FIG. 6 illustrates source follower circuitry 10, which effectively comprises two sets of the source follower circuitry 1.

The source follower circuitry 10 comprises a first input transistor 12 (MI1), a second input transistor 22 (MI2), a first bias transistor 14 (MB1) and a second bias transistor 24 (MB2), all of which are n-channel field-effect transistors (e.g. NMOS transistors) in this example.

The source follower circuitry 10 receives first and second input signals (VIP, VIN) at the gate terminals of the first and second input transistors 12, 22, respectively. The second input signal may be considered inversely proportional to the first input signal. The first and second input signals are amplified by the first and second input transistors 12, 22, respectively, and are output as first and second output signals (VOUTP, VOUTN) from corresponding first and second output nodes (source terminals of the first and second input transistors 12, 22), respectively.

The drain terminal of the first bias transistor 14 (MB1) is connected to the source terminal of the first input transistor 12 (MI1) and its source terminal is connected to ground 16. The drain terminal of the first input transistor 12 (MI1) is connected to AVD 18 (a voltage reference or voltage supply). A bias voltage VB is applied to the gate terminal of the first bias transistor 14 (MB1), in line with FIG. 1. The drain terminal of the second bias transistor 24 (MB2) is connected to the source terminal of the second input transistor 22 (MI2) and its source terminal is connected to ground 26 (which corresponds to ground 16). The drain terminal of the second input transistor 22 (MI2) is connected to AVD 28 (which corresponds to AVD 18). The bias voltage VB is applied to the gate terminal of the second bias transistor 24 (MB2), again in line with FIG. 1. Thus, the first and second bias transistors 14 and 24 are biased in the same way, leading to substantially equal bias currents.

Operation of the source follower circuitry 10 will thus already be understood in line with the operation of the source follower circuitry 1. The difference between the first and second output signals may be considered the output from the source follower circuitry 10, and is effectively dependent on the difference between the first and second input signals (VIP, VIN). Thus, the source follower circuitry 10 may be referred to as differential source follower circuitry. Of course, it is evident from FIG. 6 (by comparison with FIG. 1) that VOUTN is dependent on VIN (irrespective of VIP), and VOUTP is dependent on VIP (irrespective of VIN), and with this in mind the source follower circuitry 10 may be referred to as pseudo differential source follower circuitry.

The pseudo differential source follower circuitry 10 may be used, merely for example, as a buffer to buffer the output of a switched-capacitor circuit. FIG. 7 is a graph which illustrates the differential output (VOUTP-VOUTN) of the source follower circuitry 10 when operating as a buffer following the switched-capacitor circuit. The differential output is generated based on a single tone input provided by the switched-capacitor circuit. The amplitude of the differential output signal is normalised to the maximum input amplitude along the y-axis, with time along the x-axis. As earlier, the results illustrated by FIG. 7 were obtained by simulation in 16 nm FinFET technology.

FIG. 8 is a graph which shows a Fast Fourier Transform (FFT) of the differential output illustrated in FIG. 7, with signal level in dB along the y-axis and frequency in MHz along the x-axis. In particular, the third (HD3) and fifth (HD5) harmonics spurs are identified in FIG. 8, which are present due to the non-linearity of the circuit as explained earlier. Based on these results, the effective resolution of the output signal in terms of effective number of bits (i.e., ENOB) is around 9.3 bits in the example simulation.

Due to the CLM effects and limited output impedance of the transistors in the pseudo differential source follower circuitry 10, the circuit suffers from gain loss. Furthermore, as discussed above, the odd order harmonics present in the output signal illustrate the non-linearity of the pseudo differential source follower circuitry 10. In order to mitigate gain loss and improve linearity of the pseudo differential source follower circuitry 10, an embodiment of the present invention introduces an auxiliary circuit to the pseudo differential source follower circuitry 10, as illustrated in FIG. 9.

FIG. 9 is a schematic diagram of differential amplifier circuitry 300 according to an embodiment of the present invention, comprising main circuitry 306 and auxiliary circuitry 308.

The main circuitry 306 (which corresponds to the circuitry in FIG. 6) comprises a first main transistor (M1P) 102 and a second main transistor (M1N) 202 connected along first and second main current paths 124, 224 which pass between first and second main voltage reference nodes 108, 208 and first and second output nodes 116, 116, respectively. The source terminals of the first and second main transistors 102, 202 are connected to the first and second output nodes 116, 216, respectively. The gate terminals of the first and second main transistors 102, 202 are connected to first and second input nodes 106, 206, respectively. The drain terminals of the first and second main transistors 106, 206 are connected to a main voltage supply 312 (VDD1) via the first and second main voltage reference nodes 108, 208, respectively.

The auxiliary circuitry 308 (which is not present in FIG. 6) comprises a first auxiliary transistor (MAN) 104 and a second auxiliary transistor (MAP) 204 connected along first and second auxiliary current paths 110, 210 which pass between first and second auxiliary voltage reference nodes 112, 212 and the first and second output nodes 116, 216, respectively. The drain terminals of the first and second auxiliary transistors 104, 204 are connected to the first and second output nodes 116, 216, respectively. The gate terminals of the first and second auxiliary transistors 104, 204 are connected to the second and first input nodes 106, 206, respectively. The source terminals of the first and second auxiliary transistors 104, 204 are connected to an auxiliary voltage supply 314 (VDD2) via the first and second auxiliary voltage reference nodes 112, 212, respectively.

The main voltage supply 312 (VDD1) and the auxiliary voltage supply 314 (VDD2) could have the same voltage level as one another or different voltage levels. For example, the voltage level of the auxiliary voltage supply 314 (VDD2) could be higher than the voltage level of the main voltage supply 312 (VDD1) to provide more voltage headroom (i.e. allow a larger input voltage swing).

First and second impedances 114, 214 are connected along the first and second auxiliary current paths 110, 210 between the source terminals of the first and second auxiliary transistors 104, 204 and the first and second auxiliary voltage reference nodes 112, 212, respectively. The impedances are (e.g. passive) electrical components which provide an impedance to current flowing along the first and second auxiliary current paths 110, 210. The impedances may be or comprise, for example, degeneration resistors, or shunt capacitors (not shown) connected in parallel with degeneration resistors. By providing shunt capacitors in parallel with degeneration resistors along the first and second auxiliary current paths 110, 210, the auxiliary circuit provides additional gain boosting of high frequency input signals.

The degeneration resistors could be implemented as a switched array of resistors (i.e. a variable resistor), so that the resistance values can be controlled to control the performance of the overall circuitry 300.

The differential amplifier circuitry 300 further comprises first and second current sources 118, 218 connected along first and second combined current paths 120, 220 which extend between the first and second output nodes 116, 216 and first and second common voltage reference nodes 122, 222, respectively. The first and second current sources 118, 218 are therefore configured such that a first sum of currents flowing in the first main current path 124 and the first auxiliary current path 110 flows in the first combined current path 120 and is controlled by the first current source 118, and a second sum of currents flowing in the second main current path 224 and the second auxiliary current path 210 flows in the second combined current path 220 and is controlled by the second current source 218.

The first and second common voltage reference nodes 122, 222 are connected to a common voltage reference or supply 310, in this case ground supply (GND).

The first and second current sources 118, 218 may be first and second bias transistors configured to provide a substantially constant and substantially equal (DC) bias current flowing along the first and second combined current paths 120, 220, respectively. In the present embodiment, the first current source 118 is implemented as a transistor (Mbp) which corresponds to the first bias transistor 14 (MB1) in FIG. 6. Similarly, the second current source 218 is implemented as a transistor (Mbn) which corresponds to the second bias transistor 24 (MB2) in FIG. 6. The transistors of the first and second current sources 118, 218 are matched and controlled at their gate terminals by a common bias voltage (VB), again in line with FIG. 6, leading to the substantially equal bias currents.

The transistors 102, 202, 118, 218 are n-channel field-effect transistors (e.g. NMOS transistors) in the present embodiment. The transistors 104, 204 are p-channel field-effect transistors (e.g. PMOS transistors), i.e. of an opposite conductivity type to transistors 102, 202, 118, 218. Of course, the differential amplifier circuitry 300 could be provided "the other way up", swapping p-channel devices for n-channel devices, and vice versa. The skilled person will appreciate that this applies equally to FIGS. 1 and 6.

Operation of the differential amplifier circuitry 300 will now be explained with reference to first and second subcircuits 302, 304 illustrated in FIG. 10, which presents the circuitry 300 in simplified form. Each subcircuit comprises elements of the main circuitry 306 and the auxiliary circuitry 308, as discussed below.

The first subcircuit 302 comprises the first current source 118, the first main transistor 102, which receives a first input signal (VINP) from the first input node 106, the first auxiliary transistor 104, which receives a second input signal (VINN) from the second input node 206, and the first impedance 114. In the case of fully differential operation, when the first input signal VINP increases (causing the magnitude of the gate-source voltage of the first main transistor 102 to increase) the second input signal decreases (causing the magnitude of the gate-source voltage of the first auxiliary transistor 104 to also increase).

The first and second input signals are generated by an input voltage signal (not shown). The relationship between the first input signal, the second input signal and the input voltage signal is illustrated, as follows:

$$V_{in} = VINP - VINN \quad (9)$$

where $V_{in}$ is the input voltage signal, VINP is the first input signal and VINN is the second input signal.

The input voltage single may alternatively be referred to as a differential input signal, and the first and second input signals may alternatively be referred to as component input signals of the differential input signal.

The first impedance 114 provides a substantially linear voltage to current conversion for the first auxiliary transistor 104. So, as the source-gate voltage of the first auxiliary transistor 104 increases, the current flowing through the first auxiliary transistor 104 increases in a substantially linear relationship to the input voltage ($V_{in}$).

Since the first current source 118 provides a constant current flowing along the first combined current path 120, the bias current of the first main transistor 102 decreases with a substantially linear relationship to the input voltage. So, the bias current of the first main transistor 102 is proportional to $1/V_{in}$, while the bias current of the first auxiliary transistor 104 is proportional to $V_{in}$. That is, the first current source 118 controls the bias current of the first main transistor 102 to be inversely proportional to the bias current of the first auxiliary transistor 104 in order that the summation of currents flowing through the first combined current path 120 remains constant. By controlling the summed currents to be constant in the first combined current path 120, the first current source 118 ensures that the auxiliary circuit components of the first subcircuit 302 do not affect the power consumption of the differential amplifier circuitry 300 (i.e. no additional power is consumed by the auxiliary circuit components).

The second subcircuit 304 comprises the second current source 218, the second main transistor 202, which receives the second input signal from the second input node 206, the second auxiliary transistor 204, which receives the first input signal from the first input node 106, and the second impedance 214. The second subcircuit 304 operates in a similar manner to the first subcircuit 302. That is, the second current source 218 controls the bias current of the second main transistor 202 to be inversely proportional to the bias current of the second auxiliary transistor 204 in order that the summation of currents flowing through the second combined current path 220 remains constant. As with the first subcircuit 302, by controlling the summed currents to be constant in the second combined current path 220, the second current source 118 ensures that the auxiliary circuit components of the second subcircuit 302 do not affect the power consumption of the differential amplifier circuitry 300.

In order to illustrate how the relationship between bias current and input voltage can help to improved gain and linearity, a small signal AC model analysis of the first subcircuit 302 (i.e. a half circuit model) is discussed below, with reference to FIG. 11.

FIG. 11 illustrates a small signal AC model of the first subcircuit 302 ignoring the output conductances of the first main transistor 102 and the first auxiliary transistor 104. Ignoring the output conductances of these transistors gives a simpler equation to discuss the operation of the circuit without compromising the concept which will be discussed below. In fact, the transconductances of the first main transistor 102 and the first auxiliary transistor 104 generate large signal variations which mask the variation of the output conductances of these transistors.

Small signal AC model analysis of the first subcircuit 302 results in the following gain equation:

$$A_V = \frac{Vout/2}{Vin/2} = \frac{Vout}{Vin} = 1 + \frac{g_{m,MAN} \times g}{g_{m,M1P} \times (g + g_{m,MAN})} \quad (10)$$

The second term in equation (10) shows the additional gain added to the first subcircuit 302 due to the auxiliary circuitry 308. This additional gain ensures that the gain provided by the first subcircuit 302 is greater than 1.

As discussed above, the bias current of the first main transistor 102 is proportional to the inverse of the input voltage. Therefore, the transconductance of the first main transistor 102 is proportional to the inverse of the square root of the input voltage. These two relationships can be represented as follows:

$$I_{M1P} \propto \frac{1}{V_{in}}, \; g_{m,M1P} \propto \frac{1}{\sqrt{V_{in}}} \quad (11)$$

The bias current of the first auxiliary transistor 104 is proportional to the input voltage, so the transconductance of the first auxiliary transistor 104 is proportional to the square root of the input voltage. These two relationships can be represented as follows:

$$I_{MAN} \propto V_{in}, \; g_{m,MAN} \propto \sqrt{V_{in}} \quad (12)$$

The contribution of the auxiliary circuit components to the additional gain, illustrated in equation (10), can be rewritten as follows:

$$G_{AUX} = \frac{g_{m,MAN} \times g}{g + g_{m,MAN}} = \frac{1}{\frac{1}{g} + \frac{1}{g_{m,MAN}}} \quad (13)$$

The physical components that contribute to the terms represented in equation (13) are the first and second impedances 114, 214 of the auxiliary circuitry 308 and the first auxiliary transistor 104 (i.e. the equivalent conductance of two series resistors R and $$\frac{1}{g_{m,MAN}},$$

which is called $G_{AUX}$).

According to equation (12), it can be expected that:

$$G_{AUX} \propto \sqrt{V_{in}} \quad (14)$$

The gain of the first subcircuit 302, illustrated by equation (10) above, can be rewritten as follows:

$$A_V = 1 + \frac{G_{AUX}}{g_{m,M1P}} \quad (15)$$

Considering the relationships illustrated by equations (11) and (14), it can be seen that the additional gain in (15), which is illustrated by the term $$\frac{G_{AUX}}{g_{m,M1P}},$$

varies proportionally to the input signal, as follows:

$$\Delta A_V = \frac{G_{AUX}}{g_{m,M1P}} \propto \frac{\sqrt{V_{in}}}{\frac{1}{\sqrt{V_{in}}}} \propto V_{in} \quad (16)$$

The term "$\Delta Av$" is the input voltage dependent term of the first subcircuit 302 gain. The relationship illustrated by equation (16) is the key to understanding the linearity of the differential amplifier circuitry 300 of FIG. 9.

$$V_{outp} = A_V \times V_{inp} = (1 + \Delta A_V) \times \frac{V_{in}}{2} = \frac{V_{in}}{2} + \left[\Delta A_V\left(\frac{V_{in}}{2}\right) \times \frac{V_{in}}{2}\right] \quad (17)$$

where $V_{outp}$ and $V_{inp}$ are the AC signals of VOUTP and VINP (see FIG. 9), respectively.

The term $$\Delta A_V\left(\frac{V_{in}}{2}\right)$$

can be replaced with a first order polynomial as follows:

$$\Delta A_V(V_{in}) = \beta_0 + (\beta_1 \times V_{in}) \quad (18)$$

Substituting equation (18) into equation (17) gives h following result:

$$V_{outp} = \frac{V_{in}}{2} + \left\{\left[\beta_0 + \left(\beta_1 \times \frac{V_{in}}{2}\right)\right] \times \frac{V_{in}}{2}\right\} = \quad (19)$$

$$\frac{V_{in}}{2} + \left(\frac{\beta_0 \times V_{in}}{2}\right) + \left(\frac{\beta_1 \times V_{in}^2}{4}\right) = \left[(1+\beta_0) \times \frac{V_{in}}{2}\right] + \left[\frac{\beta_1 \times V_{in}^2}{4}\right]$$

Exactly the same maths holds for the second subcircuit 304 (i.e. the other half circuit), except the second input signal is inversely proportional to the first input signal $$\left(\text{i.e. } V_{in} \text{ is } -\frac{V_{in}}{2}\right),$$

as follows:

$$V_{outn} = \left[-(1+\beta_0) \times \frac{V_{in}}{2}\right] + \left[\frac{\beta_1 \times V_{in}^2}{4}\right] \quad (20)$$

The fully differential output AC signal can be represented as follows:

$$V_{out} = V_{outp} - V_{outn} = (1+\beta_0) \times V_{in} \quad (21)$$

As can be seen from equations (17) to (21), the non-linear term, which is due to the signal dependent gain, is the main source of second-order harmonics which cause second order distortion. This is contrary to the source follower circuitry 1 of FIG. 1, where odd order harmonics are generated, as illustrated in equation (8).

Due to the differential operation of the differential amplifier circuitry, the even order harmonics will eventually be removed, as illustrated in equation (21). Removal of these second-order harmonics significantly improves linearity and reduces distortion compared to source follower circuitry 1 or pseudo differential source follower circuitry 10.

In order to further verify the effectiveness of the auxiliary circuitry 308 of the differential amplifier circuitry 300, the circuit 300 of FIG. 9 was simulated under the same test conditions as for the source follower circuit 1 of FIG. 1. The results of this simulation are illustrated in FIGS. 12 to 15, and were obtained by simulation in 16 nm FinFET technology.

FIG. 12 presents graphs which illustrate the transconductances of the first main transistor 102 and the first auxiliary transistor 104 with respect to the first input signal. The input transconductance of the first main transistor 102 (top graph of FIG. 12) is normalised to its value at common mode voltage with respect to the (differential) input signal normalised to the input common mode voltage. The transconductance of the first auxiliary transistor 104 (bottom graph of FIG. 12) is normalised to the transconductance of the first main transistor 102 at common mode voltage with respect to the normalised (differential) input signal.

Comparing the top and bottom graphs of FIG. 12 illustrates that the transconductance of the first and second auxiliary transistors 104, 204 is a small fraction of the first and second main transistors 102, 202. This results in just a small extra capacitive loading due to the auxiliary circuit on the input rails.

FIG. 13 illustrates the small signal single-ended gain of the differential amplifier circuitry 300 with respect to the (differential) input signal. Gain at the first output node 116 with respect to the input voltage is illustrated in the top graph of FIG. 13. Gain at the second output node 216 with respect to the input voltage is illustrated in the bottom graph of FIG. 13.

As can be seen in the two graphs of FIG. 13, there is a substantially linear relationship between the gain of the differential amplifier circuitry 300 with respect to the input voltage, as predicted in equation (16).

The two graphs of FIG. 13 also illustrate some non-linear behaviour at extreme high and low values of the input voltage. This non-linear behaviour is mainly due to the variation and effect of the output conductances of the transistors 102, 202, 104, 204, which are ignored in the aforementioned discussions. The output conductances introduce some higher-order terms in equation (18), which translates to higher order harmonics in the first and second output signals. However, as discussed below in relation to FIG. 14, the second-order harmonic of the differential amplifier circuitry 300 are removed in the fully differential output, which thereby reduces distortion and improves linearity.

FIG. 14 is a graph which shows an FFT spectrum of the first output signal of the differential amplifier circuitry 300, in which a single tone sine wave is received at the first input node 106 as the first input signal, with signal level in dB along the y-axis and frequency normalised to the sampling frequency (i.e. f/f$_s$) along the x-axis.

A comparison of the FFT in FIG. 14 to the FFT of FIG. 8 illustrates a significant reduction in the third-order harmonic spur (HD3) from −58 dB to −89.3 dB, while a second-order harmonic spur (HD2) is introduced in the FFT of FIG. 14. As discussed above, this second-order harmonic spur is eventually removed in the fully differential output.

FIG. 15 is a graph which shows an FFT of the differential output from the differential amplifier circuitry 300, with signal level in dB along the y-axis and frequency normalised to the sampling frequency (i.e. f/f$_s$) along the x-axis. As expected, the second-order harmonic is removed in the differential output, while the third-order (HD3) and fifth-order (HD5) harmonic spurs remain. The ENOB provided by the differential amplifier circuitry 300 in the present simulation is around 11.9 bits, which illustrates an enhancement to the linearity of the differential amplifier circuitry 300 of around 2.6 bits, compared to the pseudo differential source follower circuitry 10 of FIG. 6.

In overview, the FIG. 9 circuitry allows enhancement of the source follower nonlinearity without imposing considerable power/area/loading penalty to the structure, and compensation of the gain loss of the circuit as a unity gain buffer.

By introducing an auxiliary circuit which is normally a small fraction of the main circuit, a small amount of gain is added to the signal path. This extra gain can compensate for the loss of the main circuit and provide gains more than 0 dB. The auxiliary circuit changes the profile of gain variation of the main circuit such that the variation is proportional to the input signal rather than the signal squared. This shifts the nonlinearity due to the gain variation (caused by the large-signal behaviour of the input signal) from a third-order distortion to a second-order distortion which will be removed in a fully differential architecture. The auxiliary circuit does not impose any extra power consumption to the structure, given that the overall bias current remains the same. Area wise, the auxiliary circuit is a small fraction of the main circuit. This minimises the extra loading on the input signal rails and consequently the loading on any preceding stages.

FIG. 16 is a schematic diagram of differential amplifier circuitry 400, being a variation of the differential amplifier circuitry 300 of FIG. 9.

The differential amplifier circuitry 400 is similar to the differential amplifier circuitry 300, and like elements have been denoted in the same way and duplicate description has been omitted.

The differential amplifier circuitry 400 differs from the differential amplifier circuitry 300 in that the auxiliary circuit 308 of the differential amplifier circuitry 400 further comprises intermediate circuitry.

In particular, the auxiliary circuit 308 further comprises first and second intermediate transistors 402, 502 connected along first and second intermediate current paths 404, 504 which pass between first and second intermediate voltage reference nodes 406, 506 and first and second common voltage reference nodes 122, 222, respectively. The gate terminals of the first and second intermediate transistors 402, 502 are connected to be controlled by the component input signals of the differential input signal provided at the second and first input nodes, respectively. The source terminals of the first and second intermediate transistors 402, 502 are connected to the first and second common voltage reference nodes 122, 222, respectively, via first and second impedances 410, 510. The impedances 410, 510 may be or comprise, for example, degeneration resistors, or shunt capacitors (not shown) connected in parallel with degeneration resistors. By providing shunt capacitors in parallel with degeneration resistors along the first and second intermediate current paths 404, 504, the auxiliary circuit 308 of the differential amplifier circuitry 400 provides additional gain boosting of high frequency input signals.

The auxiliary circuit 308 of the differential amplifier circuitry 400 further comprises first and second diode-connected transistors 408, 508 connected along the first and second intermediate current paths 404, 504 with their gate terminals connected to the gate terminals of the first and second auxiliary transistors 104, 204. The first diode-connected and auxiliary transistors 408, 104 thereby form a first current mirror, and the second diode-connected and auxiliary transistors 508, 204 thereby form a second current mirror. The source terminals of the first and second diode-connected transistors 408, 508 are connected to first and second intermediate voltage reference nodes 506, 406, respectively.

The first and second intermediate reference nodes 406, 506 are connected to an intermediate voltage supply 512. The intermediate voltage supply 512 can be connected to the auxiliary voltage supply and/or the main voltage supply such that at least two of the voltage supplies provide the same voltage. Alternatively, all three voltage supplies may provide a different voltage.

The transistors 402, 502 are n-channel field-effect transistors (e.g. NMOS transistors) in the present embodiment. The transistors 408, 508 are p-channel field-effect transistors (e.g. PMOS transistors), i.e. of an opposite conductivity type to transistors 402, 502. Of course, the differential amplifier circuitry 400 could be provided "the other way up", swapping p-channel devices for n-channel devices, and vice versa.

FIG. 17 is a schematic diagram of integrated circuitry 600 embodying the present invention. The integrated circuitry 600 comprises the differential amplifier circuitry 300 described above. The integrated circuitry 600 could be a whole IC chip or be part of an IC chip.

As mentioned earlier in connection with the pseudo differential source follower circuitry 10, the differential amplifier circuitry 300 may serves as a buffer to buffer the output of a switched-capacitor circuit. The switched-capacitor circuit could be a programmable gain amplifier. Thus, the integrated circuitry 600 could comprise the differential amplifier circuitry 300 and the switched-capacitor circuit, which in combination could be referred to as a programmable gain amplifier.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, Internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. A differential amplifier circuit comprising:
   a first voltage supply node to which a first voltage is configured to be supplied;
   a second voltage supply node to which a second voltage is configured to be supplied:
   a third voltage supply node to which a third voltage is configured to be supplied, the third voltage being different from the first and second voltages, respectively,
   a first input node at which a first input signal is configured to be received, the first input signal being one component of a differential input signal;
   a second input node at which a second input signal is configured to be received, the second input signal being the other component of the differential input signal;
   a first output node at which a first output signal is configured to be generated, the first output signal being one component of a differential output signal;
   a second output node at which a second output signal is configured to be generated, the second output signal being the other component of the differential output signal;
   a first main transistor of a first conductivity type, the first main transistor being electrically connected between the first voltage supply node and the first output node and being controlled by the first input signal received at the first input node, the first output node being electrically connected to the third voltage supply node via a first connecting circuit;
   a second main transistor of the first conductivity type, the second main transistor being electrically connected between the first voltage supply node and the second output node and being controlled by second input signal received at the second input node, the second output node being electrically connected to the third voltage supply node via a second connecting circuit;
   a first auxiliary transistor of a second conductivity type which is opposite to the first conductivity type, the first auxiliary transistor being electrically connected between the second voltage supply node and the first output node and being controlled by the second input signal received at the second input node; and
   a second auxiliary transistor of the second conductivity type, the second auxiliary transistor being electrically connected between the second voltage supply node and the second output node and being controlled by the first input signal received at the first input node.

2. The differential amplifier circuit of claim 1, wherein the first connecting circuit includes a first current source; and the second connecting circuit includes a second current source.

3. The differential amplifier circuit of claim 1, comprising:
a first impedance which is electrically connected in series with the first auxiliary transistor between the second voltage supply node and the first output node; and
a second impedance which is electrically connected in series with the second auxiliary transistor between the second voltage supply node and the second output node.

4. The differential amplifier circuit of claim 3, wherein each of the first and second impedances includes a resistor.

5. The differential amplifier circuit of claim 3, wherein each of the first and second impedances includes a resistor and a capacitor electrically connected in parallel with the resistor.

6. The differential amplifier circuit of claim 1, wherein the first voltage is the same as the second voltage.

7. The differential amplifier circuit of claim 1, wherein the first voltage is different from the second voltage.

8. The differential amplifier circuit of claim 1, comprising:
a fourth voltage supply node to which a fourth voltage is configured to be supplied; a first intermediate transistor of the first conductivity type, the first intermediate transistor being electrically connected between the fourth voltage supply node and the third voltage supply node and being controlled by the first input signal received at the
first input node;
a second intermediate transistor of the first conductivity type, the second intermediate transistor being electrically connected between the fourth voltage supply node and the third voltage supply node and being controlled by the second input signal received at the second input node;
a first diode-connected transistor of the second conductivity type, the first diode-connected transistor being electrically connected in series with the first intermediate transistor between the fourth voltage supply node and the third voltage supply node, a gate of the first diode-connected transistor being electrically connected to a gate of the second auxiliary transistor so that the second auxiliary transistor is controlled by the first input signal; and
a second diode-connected transistor of the second conductivity type, the second diode-connected transistor being electrically connected in series with the first intermediate transistor between the fourth voltage supply electrically connected node and the third voltage supply node, a gate of the second diode-connected transistor being electrically connected to a gate of the first auxiliary transistor so that the first auxiliary transistor is controlled by the second input signal.

9. The differential amplifier circuit of claim 8, wherein
the first diode-connected transistor and the second auxiliary transistor form a first current mirror circuit, and
the second diode-connected transistor and the first auxiliary transistor form a second current mirror circuit.

10. The differential amplifier circuit of claim 8, comprising:
a third impedance which is electrically connected in series with the first intermediate transistor between the fourth voltage supply node and the third voltage supply node; and a fourth impedance which is electrically connected in series with the second auxiliary transistor between the fourth voltage supply node and the third voltage supply node.

11. The differential amplifier circuit of claim 10, wherein each of the third and fourth impedances includes a resistor.

12. The differential amplifier circuit of claim 10, wherein each of the third and fourth impedances includes a resistor and a capacitor electrically connected in parallel with the resistor.

13. The differential amplifier circuit of claim 8, wherein the fourth voltage is the same as at least one of the first voltage and the second voltage.

14. The differential amplifier circuit of claim 8, wherein the fourth voltage is different from the first and second voltages, respectively.

15. The differential amplifier circuit of claim 2, comprising:
a first main current path which is configured to be formed between the first voltage supply node and the first output node and along which the first main transistor is configured to be electrically connected;
a second main current path which is configured to be formed between the first voltage supply node and the second output node and along which the second main transistor is configured to be electrically connected;
a first auxiliary current path which is configured to be formed between the second voltage supply node and the first output node and along which the first auxiliary transistor is configured to be electrically connected;
a second auxiliary current path which is formed between the second voltage supply node and the second output node and along which the second auxiliary transistor is configured to be electrically connected;
a first combined current path which is configured to be formed between the first output node and the third voltage supply node and along which the first current source is configured to be electrically connected, and
a second combined current path which is configured to be formed between the second output node and the third voltage supply nod and along which the second current source is configured to be electrically connected,
wherein a first sum of currents flowing in the first main current path and the first auxiliary current path is configured to flow in the first combined current path and is controlled by the first current source, and
wherein a second sum of currents flowing in the second main current path and the second auxiliary current path is configured to flow in the second combined current path and is controlled by the second current source.

16. An integrated circuit comprising:
an internal circuit configured to perform a process; and a differential amplifier circuit including:
a first voltage supply node to which a first voltage is configured to be supplied;
a second voltage supply node to which a second voltage is configured to be supplied:
a third voltage supply node to which a third voltage is configured to be supplied, the third voltage being different from the first and second voltages, respectively,
a first input node at which a first input signal is configured to be received, the first input signal being one component of a differential input signal;
a second input node at which a second input signal is configured to be received, the second input signal being the other component of the differential input signal;

a first output node at which a first output signal is configured to be generated, the first output signal being one component of a differential output signal;

a second output node at which a second output signal is configured to be generated, the second output signal being the other component of the differential output signal;

a first main transistor of a first conductivity type, the first main transistor being electrically connected between the first voltage supply node and the first output node and being controlled by the first input signal received at the first input node, the first output node being electrically connected to the third voltage supply node via a first connecting circuit;

a second main transistor of the first conductivity type, the second main transistor being electrically connected between the first voltage supply node and the second output node and being controlled by second input signal received at the second input node, the second output node being electrically connected to the third voltage supply node via a second connecting circuit;

a first auxiliary transistor of a second conductivity type which is opposite to the first conductivity type, the first auxiliary transistor being electrically connected between the second voltage supply node and the first output node and being controlled by the second input signal received at the second input node; and a second auxiliary transistor of the second conductivity type, the second auxiliary transistor being electrically connected between the second voltage supply node and the second output node and being controlled by the first input signal received at the first input node, wherein the differential amplifier circuit is configured to receive an output signal of the internal circuit as the differential input signal.

* * * * *